United States Patent
Werkman et al.

(10) Patent No.: US 7,042,552 B1
(45) Date of Patent: May 9, 2006

(54) ALIGNMENT STRATEGY OPTIMIZATION METHOD

(75) Inventors: Roy Werkman, Waalre (NL); Franciscus Bernardus Maria Van Bilsen, Eindhoven (NL); Bart Swinnen, Holsbeek (BE)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/990,335

(22) Filed: Nov. 17, 2004

(51) Int. Cl.
 *G03B 27/52* (2006.01)
 *G03B 27/42* (2006.01)

(52) U.S. Cl. .......................... 355/55; 355/53
(58) Field of Classification Search .................. 355/52, 355/53, 55, 67, 77; 430/311; 438/14; 250/548; 356/399–401
See application file for complete search history.

(56) References Cited

U.S. PATENT DOCUMENTS

| | | | | |
|---|---|---|---|---|
| 5,243,377 A | * | 9/1993 | Umatate et al. | .............. 355/53 |
| 6,716,649 B1 | * | 4/2004 | Ziger | .......................... 438/14 |
| 6,914,666 B1 | * | 7/2005 | Oishi | .......................... 355/53 |
| 6,946,411 B1 | * | 9/2005 | Knappe et al. | ............. 438/800 |

* cited by examiner

*Primary Examiner*—Henry Hung Nguyen
(74) *Attorney, Agent, or Firm*—Pillsbury Winthrop Shaw Pittman, LLP

(57) ABSTRACT

The invention relates to a method of optimizing an alignment strategy for processing batches of substrates in a lithographic projection apparatus. First, all substrates in a plurality of batches of substrates in the lithographic projection apparatus are sequentially aligned and exposed using a predefined alignment strategy. Then, alignment data is determined for each substrate in the plurality of batches of substrates. Next, at least one substrate in each batch of substrates is selected to render a set of selected substrates including at least one substrate in each batch. In a metrology tool, overlay data for each of the selected substrates is determined. Then, overlay indicator values for a predefined overlay indicator are calculated for the predefined alignment strategy and for other possible alignment strategies. In this calculation, the alignment data and the overlay data of the selected substrates is used. Finally, an optimal alignment strategy is determined, the strategy being defined as alignment strategy among the predefined alignment strategy and the other possible alignment strategies with a lowest overlay indicator value.

8 Claims, 9 Drawing Sheets

Fig 3

| substr. | order | Tx | Ty | Rzx | Rzy | Mx | My |
|---|---|---|---|---|---|---|---|
| 1 | 1 | -3 | 5 | -3 | 1 | -5 | 1 |
| 1 | 2 | -2 | -2 | 3 | -2 | 2 | 1 |
| 1 | 3 | 1 | 4 | 1 | -4 | -2 | 5 |
| 1 | 4 | 3 | 1 | 4 | -2 | -4 | 2 |
| 2 | 1 | -4 | -4 | -5 | 0 | 1 | 4 |
| 2 | 2 | 3 | -1 | -2 | 1 | -5 | -3 |
| 2 | 3 | 2 | 1 | 4 | -3 | -4 | -1 |
| 2 | 4 | 2 | 2 | 3 | -3 | -3 | 2 |
| 3 | 1 | -4 | -5 | 1 | -1 | 4 | -5 |
| 3 | 2 | -3 | 1 | 2 | -1 | 0 | 4 |
| 3 | 3 | -4 | -3 | 3 | 4 | 4 | 4 |
| 3 | 4 | -4 | 1 | 4 | -2 | -2 | -2 |
| 4 | 1 | 0 | 3 | -4 | 3 | 1 | 4 |
| 4 | 2 | 3 | -2 | 0 | -5 | 1 | 1 |
| 4 | 3 | -5 | -3 | -1 | 0 | -1 | 0 |
| 4 | 4 | -3 | -1 | -4 | 0 | -5 | -2 |
| 5 | 1 | -4 | 0 | -2 | 3 | -1 | 1 |
| 5 | 2 | 1 | 2 | 3 | 0 | 0 | 2 |
| 5 | 3 | -2 | 4 | 3 | -1 | 5 | -1 |
| 5 | 4 | 3 | -3 | -5 | 0 | 2 | 2 |
| ⋮ | ⋮ | ⋮ | ⋮ | ⋮ | ⋮ | ⋮ | ⋮ |
| ⋮ | ⋮ | ⋮ | ⋮ | ⋮ | ⋮ | ⋮ | ⋮ |

Fig 4

| Substr. | Tx | Ty | Rzx | Rzy | Mx | My |
|---|---|---|---|---|---|---|
| 1 | -2 | -5 | -1 | 0 | -2 | 1 |
| 2 | -1 | -4 | -1 | -5 | 1 | 2 |
| 3 | 3 | -3 | -2 | 0 | 3 | 3 |
| 4 | -2 | 3 | -2 | -1 | 0 | 3 |
| 5 | 4 | -1 | 4 | 2 | 0 | -2 |
| ⋮ | ⋮ | ⋮ | ⋮ | ⋮ | ⋮ | ⋮ |
| ⋮ | ⋮ | ⋮ | ⋮ | ⋮ | ⋮ | ⋮ |

Fig 7

*Modelled Alignment data*

| substr. | order | Tx | Ty | Rrx | Rry | Mx | My |
|---|---|---|---|---|---|---|---|
| 102 | 1 | 2 | 0 | 5 | 0 | -3 | 4 |
| 102 | 2 | -5 | -2 | -1 | -3 | 4 | -4 |
| 102 | 3 | -1 | -1 | -1 | 0 | 4 | -2 |
| 102 | 4 | -1 | -1 | -3 | -4 | 5 | -1 |
| 105 | 1 | 3 | -1 | 5 | 3 | -2 | 5 |
| 105 | 2 | 0 | -1 | -3 | 0 | -4 | -1 |
| 105 | 3 | 2 | 1 | 2 | 4 | -4 | 3 |
| 105 | 4 | 5 | -3 | -2 | 3 | -5 | 1 |
| 202 | 1 | -1 | -1 | -3 | -5 | -2 | -3 |
| 202 | 2 | 2 | 3 | 3 | 3 | 3 | -4 |
| 202 | 3 | 0 | 5 | 2 | 0 | 2 | -5 |
| 202 | 4 | 4 | 3 | 4 | 2 | 2 | -3 |
| 205 | 1 | 2 | -5 | 1 | 3 | -4 | -3 |
| 205 | 2 | 1 | -4 | 1 | -4 | -3 | 4 |
| 205 | 3 | -3 | -2 | 4 | 5 | -4 | -4 |
| 205 | 4 | -2 | 0 | -1 | 0 | 4 | -3 |
| 302 | 1 | -4 | 5 | 0 | 1 | 5 | 1 |
| 302 | 2 | 3 | -4 | 1 | 5 | -1 | 1 |
| 302 | 3 | -5 | 3 | 3 | -1 | 3 | 0 |
| 302 | 4 | -4 | 3 | -3 | 2 | 4 | -2 |
| ⋮ | ⋮ | ⋮ | ⋮ | ⋮ | ⋮ | ⋮ | ⋮ |
| 2505 | 4 | 3 | 4 | -4 | -2 | -5 | 0 |

*Modelled Overlay data*

| substr. | Tx | Ty | Rrx | Rry | Mx | My |
|---|---|---|---|---|---|---|
| 102 | -5 | -1 | -4 | -1 | -2 | 0 |
| 105 | -1 | -1 | 0 | -5 | -2 | -1 |
| 202 | 1 | 4 | -4 | 3 | -3 | -1 |
| 205 | -3 | -5 | 4 | -1 | 2 | 3 |
| 302 | -4 | 2 | -3 | -2 | 1 | 0 |
| ⋮ | ⋮ | ⋮ | ⋮ | ⋮ | ⋮ | ⋮ |
| 2505 | -2 | -4 | 5 | 2 | -5 | -4 |

Fig 8

Modelled alignment data

| wafer | order | Tx |
|---|---|---|
| 1 | 1 | 0 |
| 1 | 2 | -6 |
| 1 | 3 | -15 |
| 1 | 4 | 6 |
| 2 | 1 | 0 |
| 2 | 2 | -4 |
| 2 | 3 | -10 |
| 2 | 4 | 4 |
| 3 | 1 | 0 |
| 3 | 2 | -2 |
| 3 | 3 | -5 |
| 3 | 4 | 2 |
| 4 | 1 | 0 |
| 4 | 2 | -8 |
| 4 | 3 | -20 |
| 4 | 4 | 8 |

Modelled overlay data

| wafer | Tx |
|---|---|
| 1 | 18 |
| 2 | 12 |
| 3 | 6 |
| 4 | 24 |

Derived overlay

| wafer | order | Tx | |
|---|---|---|---|
| 1 | 1 | 18 | |
| 1 | 2 | 12 | = 18 + -6 |
| 1 | 3 | 3 | = 18 + -15 |
| 1 | 4 | 24 | = 18 + 6 |
| 2 | 1 | 12 | |
| 2 | 2 | 8 | = 12 + -4 |
| 2 | 3 | 2 | = 12 + -10 |
| 2 | 4 | 16 | = 12 + 4 |
| 3 | 1 | 6 | |
| 3 | 2 | 4 | = 6 + -2 |
| 3 | 3 | 1 | = 6 + -5 |
| 3 | 4 | 8 | = 6 + 2 |
| 4 | 1 | 24 | |
| 4 | 2 | 16 | = 24 + -8 |
| 4 | 3 | 4 | = 24 + -20 |
| 4 | 4 | 32 | = 24 + 8 |

| Order | Average |
|---|---|
| 1 | 15 |
| 2 | 10 |
| 3 | 2,5 |
| 4 | 20 |

ALIGNMENT STRATEGY OPTIMIZATION METHOD

BACKGROUND OF THE INVENTION

1. Field of the Invention

The present invention relates to an alignment strategy optimization method for finding an optimal alignment strategy to process substrates in a lithographic manufacturing process.

2. Description of the Related Art

A lithographic apparatus is a machine that applies a desired pattern onto a target portion of a substrate. Lithographic apparatus can be used, for example, in the manufacture of integrated circuits (ICs). In that circumstance, a lithographic patterning device, which is alternatively referred to as a "mask" or "reticle," may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (i.e., resist).

In general, a single substrate will contain a network of adjacent target portions that are successively exposed. Known lithographic apparatus include so-called steppers, in which each target portion is irradiated by exposing an entire pattern onto the target portion in one go, while in so-called scanners, each target portion is irradiated by scanning the pattern through the projection beam in a given direction (the "scanning"-direction) while synchronously scanning the substrate parallel or anti-parallel to this direction.

During the manufacturing process, a number of patterned layers may be created on a substrate. In order to create an operating device or to provide optimal performance, it may be desirable or even necessary for the patterns of layers positioned on top of each other to be well aligned with respect to each other. Such a condition may be accomplished by accurately positioning the substrate with respect to the mask and the projection beam. In the first place, it may be desirable or necessary for the substrate to be in the focal plane of the patterned beam, in order to obtain a sharp image of the patterning structure (a process also known as "focus and leveling"). The direction associated with this distance is called the Z-direction.

Secondly, it may be desirable or necessary to accurately set the position of the substrate in the directions perpendicular to the Z-direction, i.e. the X- and Y-direction, in order to position the different layers correctly on top of each other (a process also known as "aligning"). Accurate aligning is generally done by accurately determining the position of the substrate relative to a substrate table which holds the substrate and determining the position of the substrate table with respect to the mask and projection beam. Alignment may be done using an alignment system, as described, for instance in U.S. Pat. No. 6,297,876, which is incorporated herein by reference.

Alignment is performed using the alignment system which is arranged to find the position of alignment markers on the substrate. The performance of the alignment system is one of the elements of a lithographic system that influences the overlay accuracy to a large extent. During alignment, multiple marks on the substrate are measured to obtain a coordinate system. Some advanced IC processes alter the geometry of the alignment marks, which may compromise the coordinate system. ASML's ATHENA™ Phase-Grating Alignment system offers extensive operational flexibility to cope with most advanced IC processes, because of its dual-wavelength operation and its simultaneous detection of up to the seventh diffraction order. A more extensive overview of the ATHENA alignment sensor system and its basic operation is provide in F. Bornebroek et al., "Overlay Performance in Advanced Processes", Proc. SPIE Microlithography, Vol. 4000 (2000) pp. 520–531, which is herein incorporated by reference. The ATHENA system offers great flexibility in applying an optimal alignment strategy, see, e.g., P. Hinnen et al., "Advances in Process Overlay", Proc. SPIE Microlithography, Vol. 4344 (2001) pp 114–125.

A diffraction pattern (e.g. as generated by an alignment beam projected to an alignment mark) may comprise a number of diffraction orders, and some number (for instance, seven) of the diffraction orders may be measured. Each diffraction order comprises positional information about the alignment mark. In many cases, a position of the alignment mark can be determined based on the determined position of a single diffraction order, but more accurate results may be obtained when more diffraction orders are taken into account.

The position of the substrate may be expressed by wafer model parameters such as a translation T, a rotation R, and an magnification M. The translation may be in the X-direction Tx and/or in the Y-direction Ty. The rotation may be a rotation of the x-axis about the z-axis Rzx and/or a rotation of the y-axis about the z-axis Rzy. The magnification may in the X, Mx, and/or in the Y-direction. The wafer model parameters (Tx, Ty, Rzx, Rzy, Mx, My) can be used to compute the position, magnification and/or orientation of a substrate based on the measured positions of the diffraction orders. The wafer model parameters can be used to find the optimal alignment strategy.

Alignment strategies may consist of choice of mark type and location as well as the choice of the diffraction order and wavelength to be used. The appropriate selection procedure is chosen depending on the environment (i.e. research or production). For any alignment strategy, it is possible to automate the wavelength selection during the lithographic process. For every mark, the optimal wavelength is selected based on the signal strength of each diffraction order.

Choosing the optimal strategy is important in obtaining optimal overlay. Different procedures for selecting alignment strategy have been developed to comply with different applications. Depending on the application, either a comprehensive technique to determine the ultimate strategy or a fast and adequate strategy—optimization technique is recommended. These procedures for selecting an alignment strategy calculate an 'overlay indicator' for every possible alignment strategy. The strategy with the lowest indicator is recommended, since it corresponds to a minimum process-induced overlay variance over a batch of substrates. Overlay indicators can be insensitive to processing effects that are constant over the batch, since process corrections are used to correct for these effects during production.

To select an alignment strategy, multiple alignment mark types are measured. Each measurement gives for example 14 positions from seven diffraction orders at two wavelengths. Various procedures for selecting an alignment strategy are known, such as, for example, the Overlay Metrology Tool Feedback (OVFB) procedure. For this procedure, multiple processed marks on multiple substrates are measured in a process free coordinate system. The principle of the overlay metrology tool feedback analysis is explained with reference to FIGS. 1A, 1B, 1C, 1D. In this example, only the Y-direction is discussed for reasons of simplicity.

FIG. 1A shows a substrate 1 comprising four alignment marks 2, 3, 4, 5 of a first mark type and four alignment marks 6, 7, 8, 9 of a second mark type. During production, the alignment marks 2, 3, 4, 5 are used for alignment when exposing the substrate 1. Vectors in FIG. 1A indicate a relative position of the alignment marks 2, 3, 4, 5 with respect to an active (i.e. used) grid. In addition, the alignment marks 6, 7, 8, 9 of the second mark-type are measured as well. The substrate 1 is developed and overlay is measured on an offline metrology tool.

FIG. 1B shows the substrate 1 and four overlay targets 10, 11, 12, 13 together with vectors indicating the measured overlay error. A model is applied to the measured overlay values (i.e. the length of the vectors) in order to determine the (in this example only one) wafer model parameter(s) (Ty). The (se) wafer model parameter(s) are used to calculate alignment errors of the alignment marks 2, 3, 4, 5 used for exposure and of the alternative alignment marks 6, 7, 8, 9, (see vectors in FIG. 1C).

Based on the alignment errors in FIG. 1C, a mark-type is chosen. This choice can be made in different ways. For example, as will be explained below, the value of an "Overlay Performance Indicator" (OPI) may be used. Alternatively, the alignment errors in FIG. 1C may be used to calculate the possible overlay when switching alignment marks, and the mark-type which causes the lowest overlay will then be chosen. In this example, a switch could be made from using alignment marks 2, 3, 4, 5 of the first mark type to the alignment marks 6, 7, 8, 9 of the second mark type. In FIG. 1D, the overlay errors in that case are indicated by vectors, which apparently are smaller than those in FIG. 1C.

The calculation of OPI will now be discussed. The first action is to determine the wafer model parameters for a certain alignment strategy. The batch averages are subtracted, because process correction can compensate for these. The OPI is defined as the mean plus 3 times the standard deviation of the maximum expected overlay error of each substrate. The maximum expected overlay error Max_err for a 4 parameter wafer model is given by:

$$Max\_err = \sqrt{T_x^2 + T_y^2} + wafer\_radius \cdot \sqrt{R^2 + M^2}, \quad (1)$$

with $R = (Rzx + Rzy)/2$, $M = (Mx + My)/2$ where Tx is a translation in the x-direction, Ty a translation in the y-direction, Rzx a rotation of the x-axis about the z-axis, Rzy a rotation of the y-axis about the z-axis, Mx an magnification in the direction of the x-axis, My a magnification in the direction of the y-axis, wafer_radius the radius of a substrate.

Now, the OPI is given by:

$$OPI = <Max\_err> + 3 \cdot \sigma(Max\_err) \quad (2)$$

where σ is a standard deviation over all substrates.

For a 6 parameter model, it is not possible to calculate the OPI analytically. The 6 parameter OPI value has to be calculated numerically. Once a value for the OPI for all strategies is calculated, the alignment strategy with the lowest OPI is selected since it is believed that that particular strategy results in minimal overlay.

Nowadays, overlay indicator values are calculated on single batches. Overlay indicators can be based on alignment or alignment plus overlay data. The confidence level of the indicators based on both data sources is significantly higher than the indicator based on alignment data only. Based on the values of the indicators for different alignment strategies, a decision is made on which strategy to use to expose future batches.

Alignment strategy optimization is done by calculating the values of overlay indicators on single batches that need to be fully measured on an offline metrology tool in order to get high confidence values. During regular operations, however, only a few substrates out of a batch are measured, therefore the high confidence level indicators can not be used and the alternative indicator is used which has a very low confidence level. Measuring of extra substrates on the offline metrology tool costs extra effort and time.

SUMMARY OF THE INVENTION

It is desirable to get overlay indicators with high confidence values without the need for measuring complete batches on an offline metrology tool.

As such, the principles of the present invention, as embodied and broadly described herein, provide a method of optimizing an alignment strategy for processing batches of substrates in a lithographic projection apparatus. In one embodiment, the method includes sequentially aligning and exposing substrates in a plurality of batches of substrates in accordance with a predetermined alignment strategy, determining alignment data for each substrate in the plurality of batches of substrates, selecting at least one substrate from each batch of substrates to render a set of selected substrates, and determining overlay data for each of the selected substrates. The method further includes calculating overlay indicator values of a predefined overlay indicator for the predetermined alignment strategy and for additional alignment strategies based on the alignment data and the overlay data of the set of selected substrates, and determining an optimal alignment strategy from the predetermined alignment strategy and additional alignment strategies based on the lowest overlay indicator value.

In accordance with another embodiment, there is provided a system that optimizes an alignment strategy for processing batches of substrates. The system includes a lithographic projection apparatus configured to align substrates in a plurality of batches of substrates, transfer a pattern from a patterning device onto the substrates and to produce alignment data in accordance with a predetermined alignment strategy, a metrology tool arranged to measure overlay of substrates selected from each batch and a processor arranged to receive overlay data of selected substrates from the metrology tool and alignment data from the lithographic projection apparatus. The processor calculates overlay indicator values of a predefined overlay indicator for the predetermined alignment strategy and for additional alignment strategies based on the alignment data and the overlay data and determines an optimal alignment strategy from the predetermined alignment strategy and additional alignment strategies based on the lowest overlay indicator value.

In yet a further embodiment, there is provided a device manufacturing method that operates to optimize an alignment strategy for processing batches of substrates in a lithographic projection apparatus. The device manufacturing method includes conditioning a beam of radiation, configuring the conditioned beam of radiation with a desired pattern in its cross-section, sequentially aligning and projecting the patterned beam of radiation onto substrates in a plurality of batches in accordance with a predetermined alignment strategy, and determining alignment data for each of the substrates in the plurality of batches of substrates. The method also includes selecting at least one substrate from each batch of substrates to render a set of selected substrates, determining overlay data for each of the selected substrates, calculating overlay indicator values of a predefined overlay indicator for the predetermined alignment strategy and for additional alignment strategies based on the alignment data and the overlay data of the set of selected substrates, and determining an optimal alignment strategy from the predetermined alignment strategy and additional alignment strategies based on the lowest overlay indicator value.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 3 shows an example of alignment data for a batch of substrates;

FIG. 4 shows an example of overlay data related to the batch of which the alignment data is shown in FIG. 3;

FIG. 7 shows an example of alignment and overlay data of the substrates in an artificial batch;

FIG. 8 shows a simple example on how to calculate an overlay indicator, and

DETAILED DESCRIPTION

Figure 1A:
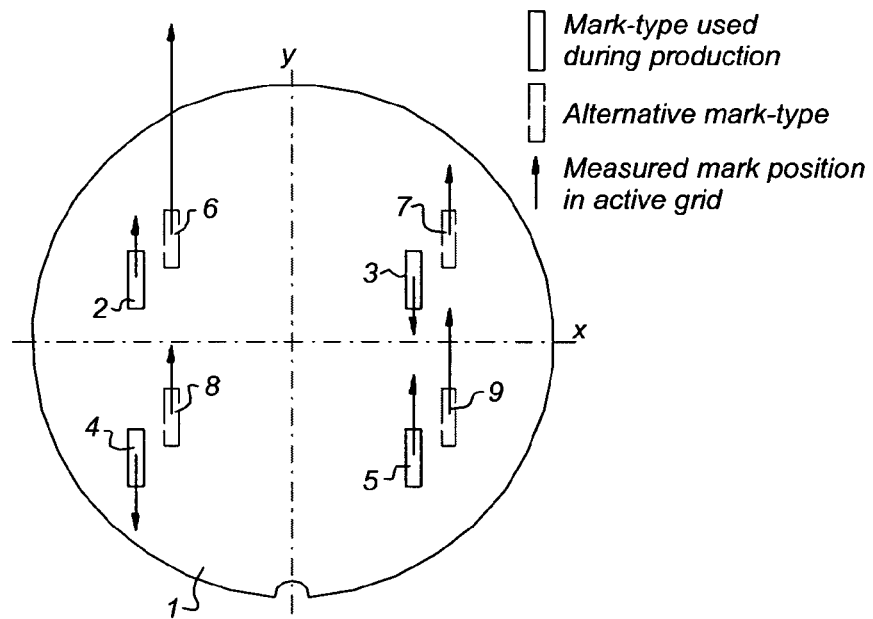
FIGS. 1A–1D show the principle of the off-line overlay metrology tool feedback analysis.
Figure 1B:
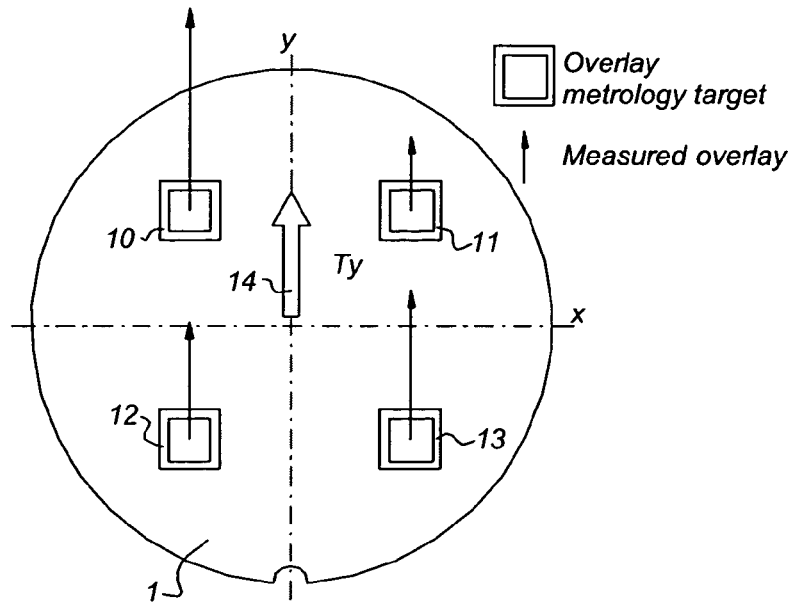
Figure 1C:
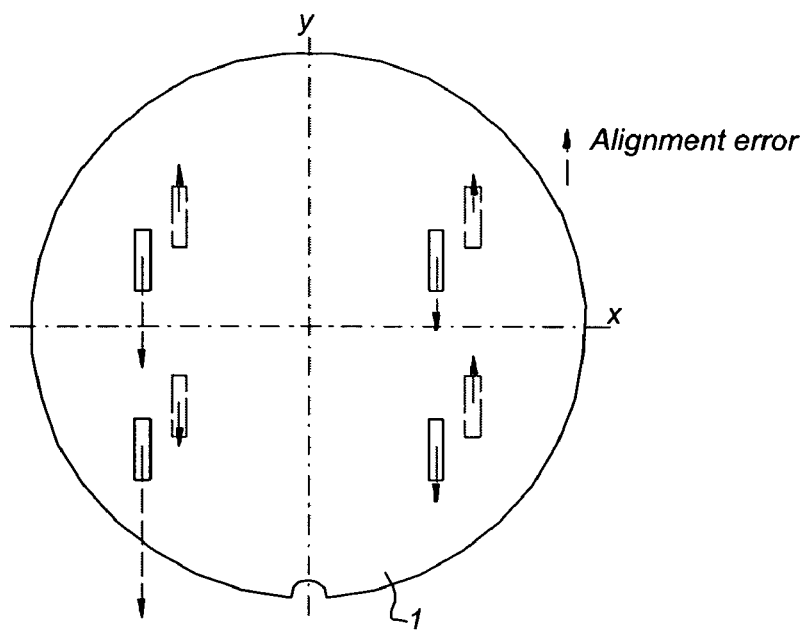
Figure 1D:
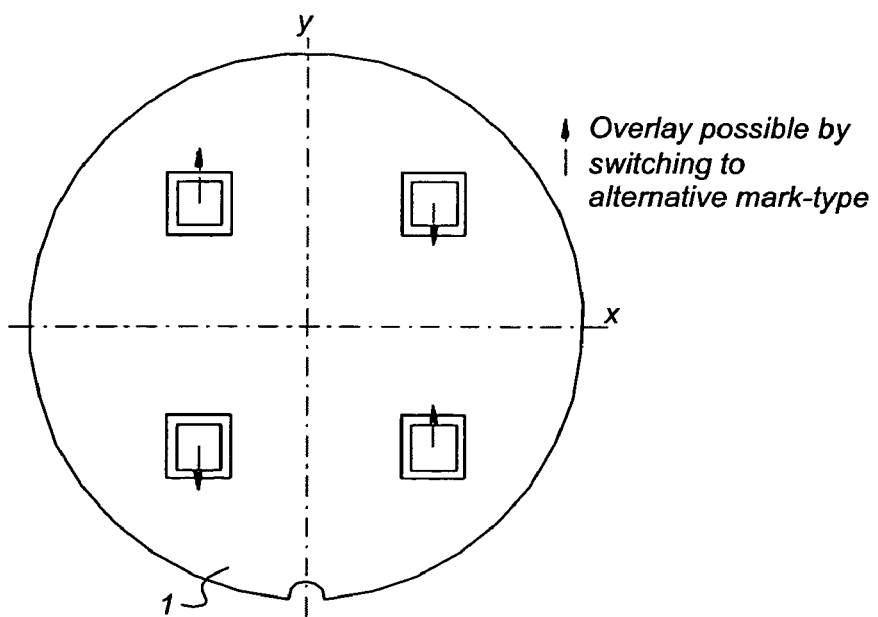
Figure 2A:
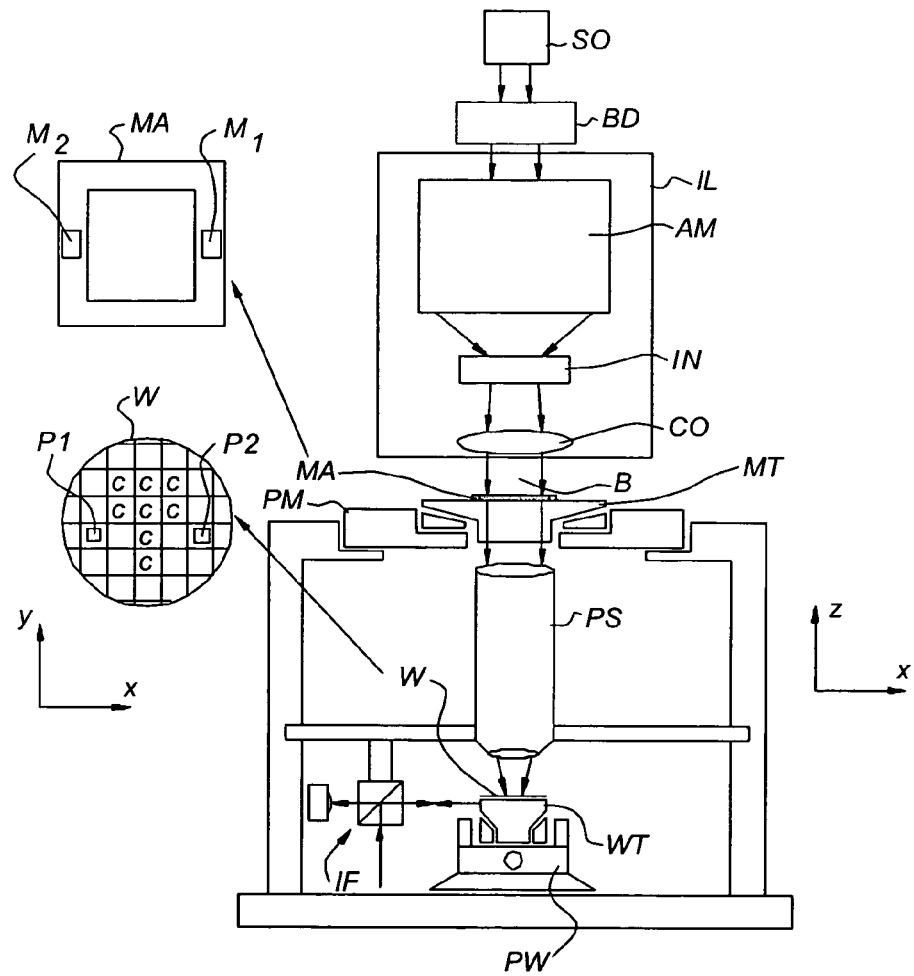
FIG. 2A depicts a lithographic apparatus as used in a system according to an aspect of the invention.

FIG. 2A schematically depicts a lithographic apparatus as may be used in a system according to an aspect of the invention. The apparatus comprises:

- an illumination system (illuminator) IL: for providing a projection beam PB of radiation (e.g., UV or EUV radiation).
- a first support structure (e.g., a mask table/holder) MT: for supporting patterning device (e.g., a mask) MA and coupled to first positioning mechanism PM for accurately positioning the patterning device with respect to item PL;
- a substrate table (e.g., a wafer table/holder) WT: for holding a substrate (e.g., a resist-coated wafer) W and coupled to second positioning mechanism PW for accurately positioning the substrate with respect to item PL; and
- a projection system (e.g., a reflective projection lens) PL: for imaging a pattern imparted to the projection beam PB by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as, for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory actions may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 2A, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 2A) can be used to accurately position the mask MA with respect to the path of the radiation beam B, e.g. after mechanical retrieval from a mask library, or during a scan.

In general, movement of the mask table MT may be realized with the aid of a long-stroke module and a short-stroke module, which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. step mode: the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. scan mode: the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. other mode: the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2B:
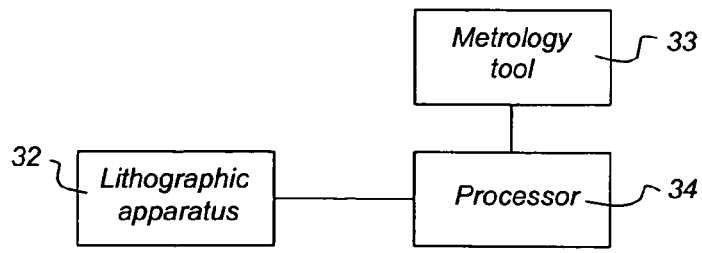
FIG. 2B depicts a system according to an aspect of the invention.

FIG. 2B depicts an example of a system, in accordance with an embodiment of the present invention. The system comprises a lithographic projection apparatus 32 arranged to transfer a pattern from a patterning device onto a substrate, not shown. Furthermore, the system comprises an overlay metrology tool 33 and a processor 34.

The metrology tool 33 is arranged to measure overlay on substrates, not shown. The processor 34 is arranged to receive overlay data from the metrology tool 33, and alignment data from the lithographic projection apparatus 32. The processor 34 may be part of the lithographic projection apparatus, but other configurations are possible. The overlay data may be received by the processor 34 directly from the overlay metrology tool 33 or from an attached software application, loaded on another processor, not shown or on the same processor 34. Preferably, the system is arranged in a computer network such as to communicate with other apparatus and/or applications.

During manufacturing processes, substrates are grouped in a box to form a particular batch. Substrates in a batch stay together throughout the entire manufacturing process. The batches pass several manufacturing actions. Two main manufacturing actions which are of interest for this invention, are the lithographic exposure action in the lithographic apparatus and an overlay inspection action in an overlay inspection station, i.e. the offline metrology tool.

In the lithographic apparatus 32, each individual substrate in a batch follows the following sequence:

1. Place a substrate on the substrate table WT,
2. Measure alignment marks and position the substrate under the lens PS,
3. Expose the substrate,
4. Place the substrate back in the box.

During sub-sequence (2), multiple alignment marks present on a substrate, are measured. To that end, a subset of all available markers may be used. Next, a wafer model is used in which wafer model parameters, such as (Tx, Ty, Rzx, Rzy, Mx, My), are determined using a least squares optimization method. In order to accurately determine the wafer's coordinate system, the position data of a number of alignment marks need to be measured. Based on the values of the wafer model parameters, a substrate will be repositioned and the magnification of the lithographic apparatus will be adjusted.

During sub-sequence (2), the position of the alignment marks may be measured with a specified diffraction order (i.e. diffraction order of the ATHENA sensor) but also with all other diffraction orders. For every diffraction order, the wafer model parameters will be determined and stored in an alignment report. A simplified example of such a report is shown in FIG. 3. For clarity reasons, only 4 diffraction orders are represented (normally 7 diffraction orders * 2 colors are collected per substrate). It should be noted that instead of using diffraction orders only, other "alignment strategies" may be used.

FIG. 3 illustrates an example of a table with the values of wafer model parameters (Tx, Ty, Rzx, Rzy, Mx, My) for several substrates of one batch. The values indicated are nanometers, microradians, and part per million for Tx/Ty, Rzx/Rzy and Mx/My respectively. The wafer model parameters are calculated for 4 diffraction orders, so the table of FIG. 3 actually comprises 100 records. In column 2 of the table, the diffraction order is listed. The results of a single diffraction order is enough to position the substrate, the results of all other orders is then for diagnostics only. Sometimes a combination of orders is used. Note that this data file enables one to determine the adjustment of the lithographic projection apparatus in case another diffraction order would have been used.

At present, software algorithms are used which request a manufacturer to provide both data files (alignment and overlay) from a batch. Having both data files, the software performs some calculations and determines, for example, the OPI values. To enable this calculation, a manufacturer is required to verify overlay on the metrology tool on all substrates of a batch. This is because when using the above mentioned OVFB method, the OPI calculation requires that for every substrate both the alignment data and the overlay data is available.

FIG. 4 depicts an example of overlay data expressed in wafer model parameters related to the batch of which the alignment data was shown in FIG. 3. In the table of FIG. 4, only data (i.e. the wafer model parameters) of some substrates is shown. In order to utilize the overlay indicators with the high confidence levels, all substrates in a batch need to be measured in the offline metrology tool. Measuring all the substrates is very time consuming.

In one embodiment of the invention, a plurality of batches is aligned and processed in the lithographic apparatus. This plurality of batches comprises a predefined number of batches. Then, at least one substrate of every batch is selected to be measured for determining overlay data. The set of selected substrates is referred to as an "artificial batch". After having processed this set of batches, alignment data and the overlay data of the artificial batch are combined into one data-set. Preferably, to limit the measurement time, only the overlay on one or two substrates in every batch is measured.

Figure 5:
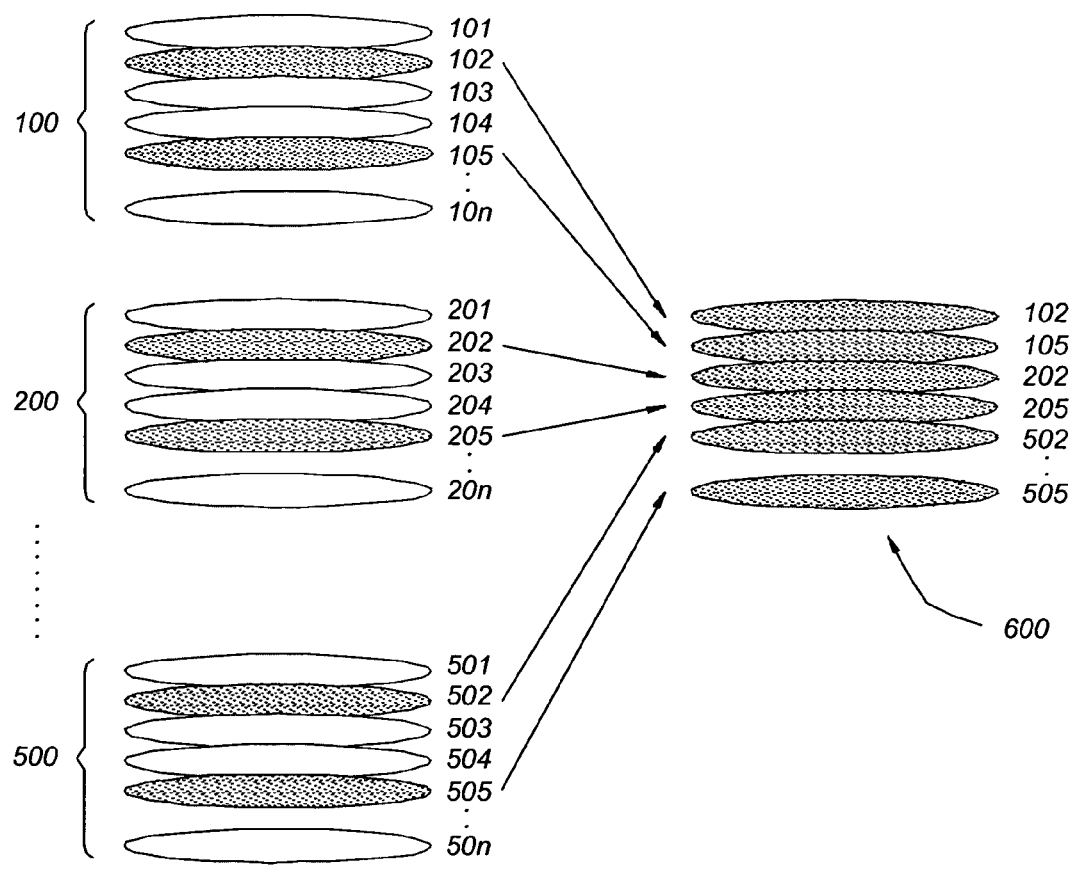
FIG. 5 schematically shows the composition of an artificial batch.

FIG. 5 schematically depicts the composition of the artificial batch. In this example, the set of batches comprise five batches, i.e. batch 100, 200, 300, 400, 500, only three of them are shown. Batch 100 comprises substrates 101-1n, batch 200 comprises substrates 201-2n, etc. (where n is an integer, typically 25). From each processed batch only a few substrates will be measured on the metrology tool. In this example, it is always the second and fifth substrate. Artificial batch 600 is composed of substrates 102, 105, 202, 205, ..., 502, 505, see FIG. 5.

Figure 6:
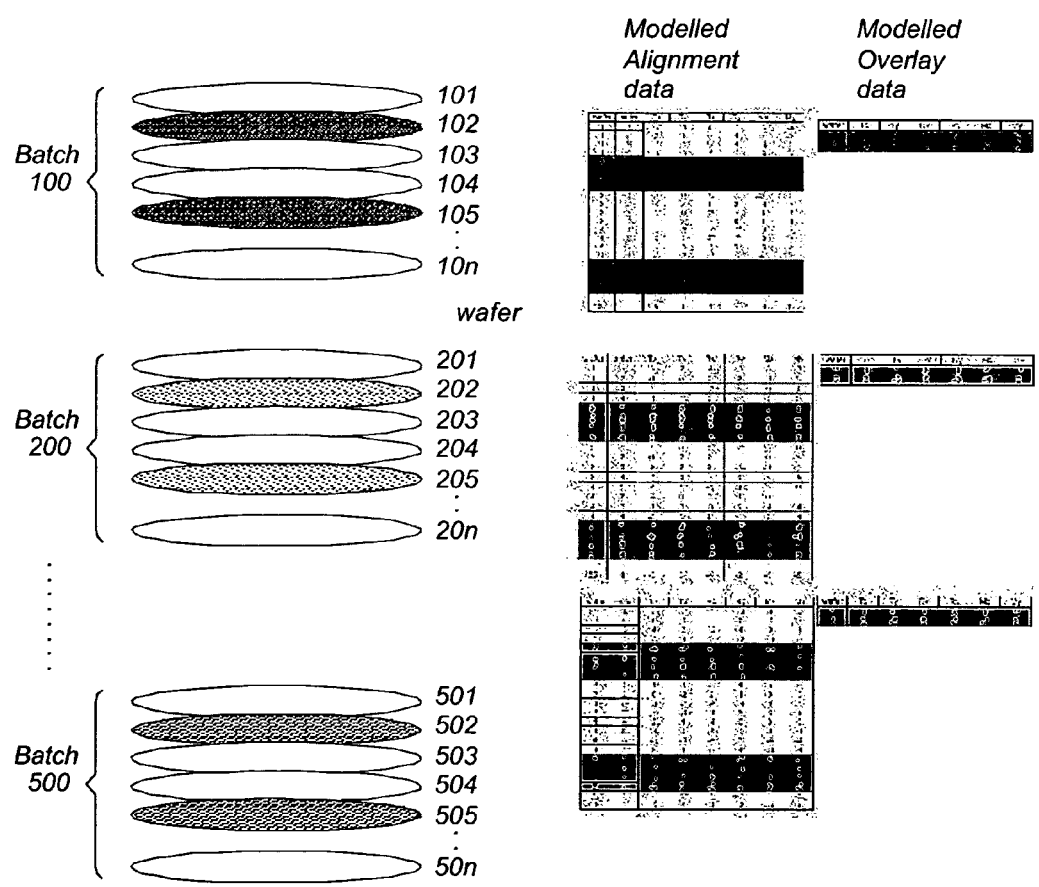
FIG. 6 shows an example of alignment and overlay data of substrates in 3 batches.

From the available alignment data, only the data belonging to the selected substrates 102, 105, 202, 205, ..., 502, 505 will be used. The data from the other substrates will be neglected. FIG. 6 shows the selected substrates and their possible alignment and overlay data. FIG. 7 shows an example of alignment and overlay data of the substrates in the artificial batch 600, i.e. substrate 102, 105, 202, 205, 302, ..., 505. According to the invention, the alignment and overlay data of the artificial batch 600 is used to calculate values for an overlay indicator, such as the OPI indicator. For each possible alignment strategy, e.g. diffraction order, a value of the overlay indicator is calculated.

Finally, an optimal alignment strategy is determined by choosing the particular alignment strategy among the current alignment strategy and the other possible alignment strategies, that has the lowest overlay indicator value. In this way, an optimal alignment strategy can be chosen, measuring only a subset (i.e. the artificial batch) of all the substrate processed.

The overlay data may be determined by measuring position errors for a plurality of overlay targets present on each of the selected substrates. This will result in so-called measured overlay data. Next, the overlay data is calculated by applying a least squares model to the measured overlay data. By modeling the measured overlay data using a least squares model, only the wafer model parameter values are processed and not all the raw data coming from the metrology tool and the alignment system. This reduces the amount of data to be processed.

Possible alignment strategies may comprise one or more of the following: (a) using a predefined alignment mark type; (b) using a predefined number of alignment marks on a substrate; (c) using predefined positions of alignment marks on a substrate; (d) using a measurement beam with a predefined wavelength in an alignment system or combination of wavelengths; (e) using a predefined diffraction order in said alignment system or combination of diffraction orders; (f) using a predefined number of wafer model parameters; (g) using a predefined position detection algorithm; and (h) using a predefined alignment system.

A position detection algorithm is an algorithm which is used to determine a position from a mark image captured by for example, a CCD element. The alignment system used may vary as well. In such a case, the alignment system may be equipped with multiple alignment sensors, as is described in K. Ota et al. "New Alignment Sensors For Wafer Stepper", Proc. SPIE Optical/Laser Microlithography IV, Vol. 1463 (1991) pp 304–314, which is herein incorporated by reference.

In another embodiment of the present invention, more than one substrate in each batch is selected to be measured on the metrology tool. The overlay indicators using compound batches concerns both inter- and intra-batch variation of wafer model parameters. In order to separate the inter- and intra-batch terms, the wafer model parameters are corrected by calculating the average parameter values per batch and then subtracting the averages from the wafer model parameters. The overlay indicator is then calculated using the corrected wafer model parameter values. In this case the overlay indicator mainly concerns the intra-batch term. An alternative overlay indicator can than be calculated using the average parameter values. In that case the overlay indicator mainly concerns the inter-batch term.

To explain the method according to the invention, a simple example is described in more detail with reference to tables in FIG. 8. The example is based on a simplified wafer model (Tx) i.e. translation X, on 4 substrates and with 4 diffraction orders. Optimization is performed using a comparison based on an average overlay per diffraction order. FIG. 8 shows alignment data, which is collected on the lithographic apparatus and overlay data as collected by the metrology tool. Note that in the third column of the alignment data table, the relative translation values compared to the first diffraction order data are shown, i.e. $\Delta Tx=Tx(\text{order } i)-Tx(\text{order } 1)$, where i is 2, 3 or 4. It is assumed that the substrates have been exposed with the first diffraction order of the ATHENA alignment system. This means that the overlay data is valid for the first diffraction order only. In case the first order is used for alignment the 4 substrates will have an overlay of 18, 12, 6 and 24 nm respectively, see, e.g., the second column of the second table.

According to an embodiment of the present invention, the overlay indicator values for the other possible alignment strategies are calculated, for all selected substrates, using so-called "derived" overlay data. This "derived" overlay data is derived from the overlay data corresponding to the predefined alignment strategy, and from the alignment data corresponding to the other possible (i.e. not used) alignment strategies. In this way, the overlay data is derived that would have been achieved when exposing the substrates by another possible alignment strategy.

An example is given in the third table of FIG. 8. The third table of FIG. 8 presents an overlay error Tx, which would have been induced in case an alternative diffraction order would have been used. The first substrate would have been positioned 6 nm to the left in case the second diffraction order would have been active. In that case, the overlay measured with the metrology tool would have been 12 nm (assuming identical metrology errors). In case the third diffraction order would have been used, the overlay measured by the metrology tool would have been 18−15=3 nm. This calculation can be performed for all order/substrate combinations resulting in a derived overlay table. Based on the derived overlay scenario, one can select the best diffraction order, by calculating the average overlay for all strategies (i.e. diffraction orders). For this example, a simple averaging has been applied which leads to a minimal overlay for the third order (the third order results in the lowest indicator). So in this case, the strategy corresponding to the third order will be used for aligning future batches.

In another embodiment, a six parameter model (Tx, Ty, Rzx, Rzy, Mx, My) is used for both the alignment and overlay data and an OPI calculation is used to select the optimum alignment strategy. The OPI indicator can be used to quantify variations in the substrate systematic, and thus is proportional to the attainable overlay. The averages of the model parameters, i.e. <Tx>, <Ty>, <Rzx>, <Rzy>, <Mx>, <My> per batch are calculated in addition to the differences between the model parameters per substrate (i) and the batch averages, i.e. Txi-<Tx>, Tyi-<Ty>, Rzxi-<Rzx>, Rzyi-<Rzy>, Mxi-<Mx>, Myi-<My>.

Because the average batch parameters can be corrected with process corrections, it is the differences from substrate to substrate that define the attainable overlay. These differences in substrate parameters (caused by the process) indicate a maximum overlay error at the edge of each substrate since that is were the largest systematic induced error will be. This maximum error (caused by the process) is also calculated, see, e.g., formula (1). For a processed substrate, one can calculate the maximum error (caused by the process) that is remaining after the average model parameters have been removed. For k processed substrates (k is an integer), k maximum errors (caused by the process) are calculated. The lower the OPI, the better the overlay.

Because this analysis is, in effect, a simulation of an actual substrate alignment in relation to a stable grid, the OPI gives the best correlation to actual overlay stability. The OPI has been shown to correlate very well with actual overlay.

According to another embodiment of the invention, there is provided a device manufacturing method comprising transferring a patterned beam of radiation onto a substrate, wherein an alignment strategy is optimized according to the method described above. The alignment strategy corresponding with the lowest overlay indicator, is used to align future batches in the lithographic apparatus (i.e. exposure tool).

Figure 9:
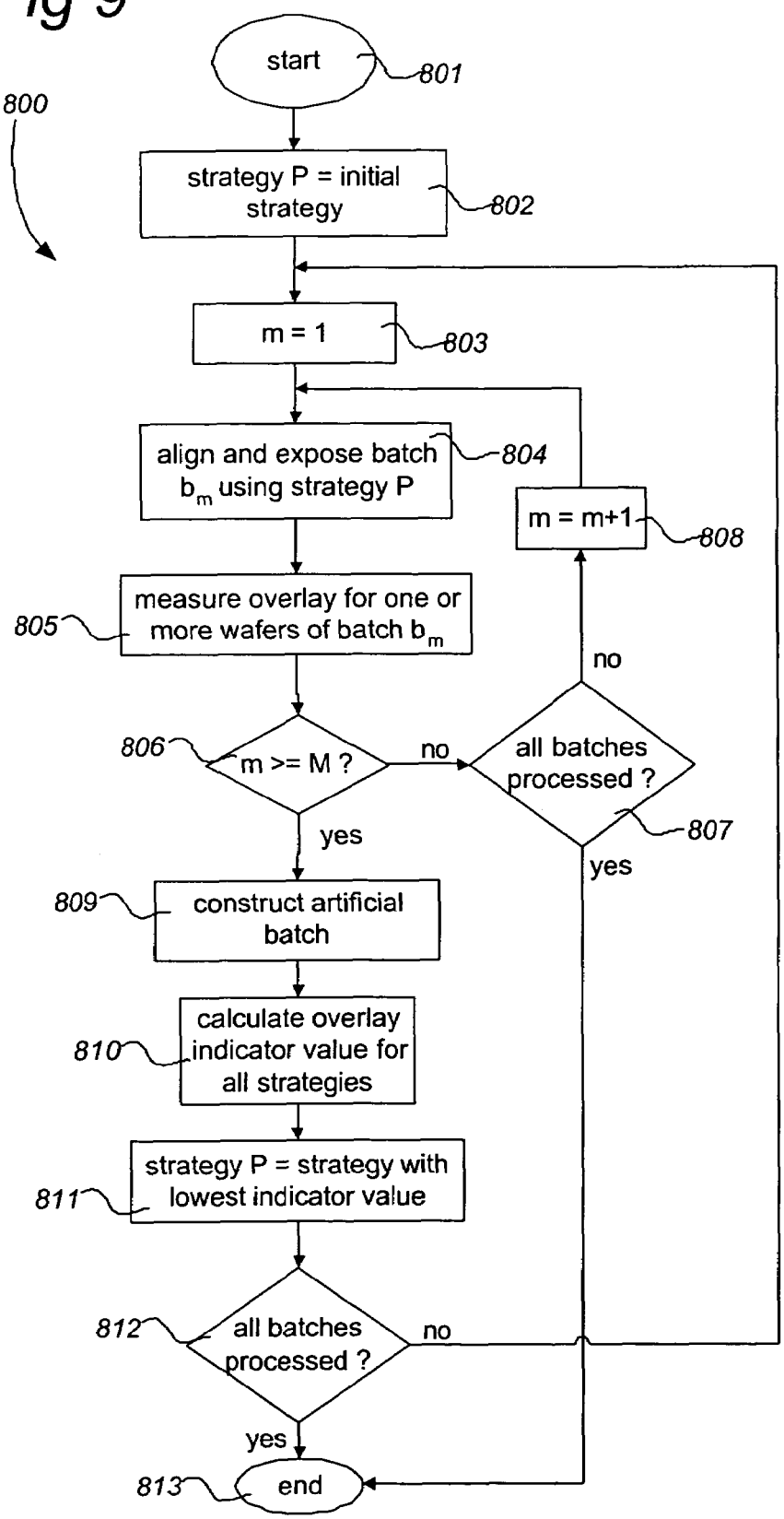
FIG. 9 is a flow chart showing an embodiment of a manufacturing method according to the invention.

FIG. 9 shows an example of a flow chart of the manufacturing method according to an embodiment of the invention. A manufacturing method 800 starts at block 801. Then in block 802, an initial strategy is selected for aligning batches $b_m$, where m=1 . . . M.

In block 803, a counter n is set to 1. Next, in block 804, substrates of batch n are aligned using 'current' strategy P and then exposed on the lithographic apparatus. Then in block 805, at least one substrate out of batch n is measured in the metrology tool, resulting in overlay data for that substrate.

In block 806, variable m is compared to the maximum number of batches used for optimization, i.e. M. If in block 806, m is not yet equal to M, then it is tested in block 807 to determined whether all batches are processed. If this is not true, block 808 follows in which m in increased by 1 and block 804 is executed again. This loop is executed until in block 806 m>=M.

In block 809, an artificial batch is composed. If in block 807 all batches are already processed, the manufacturing process ends, pursuant to block 813. The artificial batch is used to calculate overlay indicator values for all possible strategies in block 810. In block 811, the strategy corresponding to the indicator with the lowest value, is selected to be the new 'current' strategy P. If not all batches are processed yet, the result of the test 812 is NO and block 803 follows. If the result of test 812 is YES, block 813 follows which means the end of the manufacturing process.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc.

The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. Furthermore, it is possible to directly use (raw) measured data from the metrology tool in order to calculate an overlay indicator and to find the optimal alignment strategy. For example, it is possible to use the average of the raw measured data plus three times the standard deviation of the raw measured data as an indication of overlay.

The descriptions above are intended to be illustrative, not limiting. Thus, it will be apparent to one skilled in the art that modifications may be made to the invention as described without departing from the scope of the invention as defined by the appended claims.

What is claimed is:

1. A method of optimizing an alignment strategy for processing batches of substrates in a lithographic projection apparatus, said method comprising:
   sequentially aligning and exposing substrates in a plurality of batches of substrates in accordance with a predetermined alignment strategy;
   determining alignment data for each substrate in said plurality of batches of substrates;
   selecting at least one substrate from each batch of substrates to render a set of selected substrates;
   determining overlay data for each of said selected substrates;
   calculating overlay indicator values of a predefined overlay indicator for said predetermined alignment strategy and for additional alignment strategies based on said alignment data and said overlay data of said set of selected substrates; and
   determining an optimal alignment strategy from said predetermined alignment strategy and additional alignment strategies based on a lowest overlay indicator value.

2. The method of claim 1, wherein determining overlay data comprises:
   measuring position errors for a plurality of overlay targets present on each of said selected substrates to produce measured overlay data; and
   determining said overlay data by applying a least squares model to said measured overlay data.

3. The method of claim 1, wherein said calculating of said overlay indicator values comprises:
   calculating, for all selected substrates, derived overlay data using said overlay data corresponding to said predetermined alignment strategy and said alignment data corresponding to said additional alignment strategies;
   calculating said overlay indicator values for said additional alignment strategies using said derived overlay data.

4. The method of claim 1, wherein the at least one predetermined alignment strategy comprises one or more of: (a) using a predefined alignment mark type, (b) using a predefined number of alignment marks on a substrate, (c) using predefined positions of alignment marks on a substrate, (d) using a measurement beam with a predefined wavelength in an alignment system or combination of wavelengths, (e) using a predefined diffraction order in said alignment system or combination of diffraction orders, (f) using a predefined number of wafer model parameters, (g) using a predefined position detection algorithm, or (h) using a predefined alignment system.

5. The method of claim 1, wherein said alignment data and said overlay data are represented by wafer model parameters.

6. The method of claim 5, wherein more than one substrate in each batch is selected to be measured and wherein said method further comprises:
   calculating, for each selected batch, an average value of all wafer model parameters over all substrates;
   subtracting for each selected batch, and for each wafer model parameter, said average value from said wafer model parameter values to render corrected wafer model parameter values; and
   calculating the overlay indicator using said corrected wafer model parameter values.

7. A system comprising:
   a lithographic projection apparatus configured to align substrates in a plurality of batches of substrates, transfer a pattern from a patterning device onto the substrates and to produce alignment data in accordance with a predetermined alignment strategy;
   a metrology tool arranged to measure overlay of substrates selected from each batch; and
   a processor arranged to receive overlay data of selected substrates from said metrology tool and alignment data from said lithographic projection apparatus,
   wherein said processor calculates overlay indicator values of a predefined overlay indicator for said predetermined alignment strategy and for additional alignment strategies based on said alignment data and said overlay data and determines an optimal alignment strategy from said predetermined alignment strategy and additional alignment strategies based on a lowest overlay indicator value.

8. A device manufacturing method comprising:
   conditioning a beam of radiation;
   configuring the conditioned beam of radiation with a desired pattern in its cross-section;
   sequentially aligning and projecting the patterned beam of radiation onto substrates in a plurality of batches in accordance with a predetermined alignment strategy;
   determining alignment data for each of the substrates in said plurality of batches of substrates;
   selecting at least one substrate from each batch of substrates to render a set of selected substrates;

determining overlay data for each of said selected substrates;

calculating overlay indicator values of a predefined overlay indicator for said predetermined alignment strategy and for additional alignment strategies based on said alignment data and said overlay data of said set of selected substrates; and determining an optimal alignment strategy from said predetermined alignment strategy and additional alignment strategies based on the lowest overlay indicator value.

* * * * *